United States Patent
Seidl

(10) Patent No.: US 10,806,265 B2
(45) Date of Patent: Oct. 20, 2020

(54) LIGHTED CUP HOLDER FOR SEATING ARRANGEMENTS

(71) Applicant: Raffel Systems, LLC, Germantown, WI (US)

(72) Inventor: Ken Seidl, Port Washington, WI (US)

(73) Assignee: RAFFEL SYSTEMS, LLC, Germantown, WI (US)

( * ) Notice: Subject to any disclaimer, the term of this patent is extended or adjusted under 35 U.S.C. 154(b) by 0 days.

(21) Appl. No.: 16/747,095

(22) Filed: Jan. 20, 2020

(65) Prior Publication Data

US 2020/0196766 A1 Jun. 25, 2020

Related U.S. Application Data

(63) Continuation of application No. 16/422,288, filed on May 24, 2019, now Pat. No. 10,537,182, which is a (Continued)

(51) Int. Cl.
*B60N 2/00* (2006.01)
*A47C 7/68* (2006.01)
(Continued)

(52) U.S. Cl.
CPC ............... *A47C 7/68* (2013.01); *A47C 1/02* (2013.01); *A47C 1/12* (2013.01); *A47C 7/62* (2013.01);
(Continued)

(58) Field of Classification Search
CPC ........ B60N 3/102; B60N 3/106; B60N 3/103; B60N 3/108; B60N 3/101; B60N 3/107
(Continued)

(56) References Cited

U.S. PATENT DOCUMENTS

| 2,745,947 A | 5/1956 | Sansous |
| 4,254,452 A | 3/1981 | Switala |

(Continued)

FOREIGN PATENT DOCUMENTS

| CN | 2052513 | 2/1990 |
| CN | 2730684 | 10/2005 |

(Continued)

OTHER PUBLICATIONS

Scion Accessories List for xA Model Year 2006.
(Continued)

*Primary Examiner* — Steven M Marsh
(74) *Attorney, Agent, or Firm* — Casimir Jones S.C.; Tyler Sisk

(57) ABSTRACT

A method and apparatus include attaching a lighted cup holder to a seating arrangement. The lighted cup holder includes a cup holder body and a light-producing light source, with the cup holder body being attached to the seating arrangement and having a cup receptacle therein, the light-producing source being disposed within the cup receptacle for illuminating the receptacle. A light-sensitive element operatively connected to the light source selectively controls production of light by the light source in such a manner that illumination of the cup holder is provided only under conditions where visibility is reduced to the point that it becomes difficult to locate the cup holder. The light-sensitive element is mounted on a master lighted cup holder and controls illumination of the master lighted cup holder and one or more slave lighted cup holders operatively connected to the master lighted cup holder.

19 Claims, 7 Drawing Sheets

Related U.S. Application Data continuation of application No. 16/031,852, filed on Jul. 10, 2018, now Pat. No. 10,299,603, which is a continuation of application No. 15/868,191, filed on Jan. 11, 2018, now Pat. No. 10,051,968, which is a continuation of application No. 15/421,115, filed on Jan. 31, 2017, now Pat. No. 9,867,471, which is a continuation of application No. 15/018,167, filed on Feb. 8, 2016, now Pat. No. 9,585,486, which is a continuation of application No. 14/939,864, filed on Nov. 12, 2015, now Pat. No. 9,254,043, which is a continuation of application No. 14/806,912, filed on Jul. 23, 2015, now Pat. No. 9,192,241, which is a continuation of application No. 14/638,926, filed on Mar. 4, 2015, now Pat. No. 9,089,221, which is a continuation of application No. 14/263,248, filed on Apr. 28, 2014, now Pat. No. 8,973,882, which is a continuation of application No. 14/152,363, filed on Jan. 10, 2014, now Pat. No. 8,714,505, which is a continuation of application No. 12/847,823, filed on Jul. 30, 2010, now Pat. No. 8,657,245, which is a continuation of application No. 11/410,547, filed on Apr. 25, 2006, now Pat. No. 7,766,293.

(51) Int. Cl.
| | | |
|---|---|---|
| *B60N 2/75* | (2018.01) | |
| *B60N 2/90* | (2018.01) | |
| *B60Q 3/20* | (2017.01) | |
| *B60Q 3/44* | (2017.01) | |
| *B60Q 3/80* | (2017.01) | |
| *B60N 2/22* | (2006.01) | |
| *B60N 3/10* | (2006.01) | |
| *A47C 7/72* | (2006.01) | |
| *A47C 1/02* | (2006.01) | |
| *A47C 7/62* | (2006.01) | |
| *F21V 33/00* | (2006.01) | |
| *H05K 5/00* | (2006.01) | |
| *H05K 5/02* | (2006.01) | |
| *A47C 1/12* | (2006.01) | |
| *F21V 23/04* | (2006.01) | |
| *B64D 11/00* | (2006.01) | |
| *B64D 11/06* | (2006.01) | |
| *A61H 1/00* | (2006.01) | |
| *F21Y 115/10* | (2016.01) | |
| *F21W 131/301* | (2006.01) | |
| *F21Y 101/00* | (2016.01) | |
| *B60Q 3/233* | (2017.01) | |

(52) U.S. Cl.
CPC ............... *A47C 7/72* (2013.01); *A47C 7/725* (2013.01); *A61H 1/001* (2013.01); *B60N 2/22* (2013.01); *B60N 2/797* (2018.02); *B60N 2/976* (2018.02); *B60N 3/101* (2013.01); *B60Q 3/20* (2017.02); *B60Q 3/44* (2017.02); *B60Q 3/80* (2017.02); *B64D 11/00154* (2014.12); *B64D 11/064* (2014.12); *B64D 11/0636* (2014.12); *F21V 23/04* (2013.01); *F21V 23/0464* (2013.01); *F21V 33/0012* (2013.01); *H05K 5/0017* (2013.01); *H05K 5/0247* (2013.01); *A61H 2201/0149* (2013.01); *A61H 2201/0188* (2013.01); *B60Q 3/233* (2017.02); *B64D 2011/0053* (2013.01); *F21W 2131/301* (2013.01); *F21Y 2101/00* (2013.01); *F21Y 2115/10* (2016.08)

(58) Field of Classification Search
USPC .................. 248/311.2, 311.3; 362/154, 101
See application file for complete search history.

(56) References Cited

U.S. PATENT DOCUMENTS

| | | | |
|---|---|---|---|
| 4,336,574 A | 6/1982 | Goodman | |
| D282,886 S | 3/1986 | Williams | |
| D298,719 S | 11/1988 | Beckerer, Jr. | |
| 4,809,180 A | 2/1989 | Saitoh | |
| 4,858,084 A | 8/1989 | Sheryll | |
| 4,863,134 A | 9/1989 | Young et al. | |
| D305,966 S | 2/1990 | Demars | |
| 4,914,920 A | 4/1990 | Carnegie et al. | |
| 5,104,182 A | 4/1992 | Rasnick et al. | |
| 5,150,946 A | 9/1992 | Marfilius et al. | |
| 5,211,699 A | 5/1993 | Tipton | |
| 5,213,394 A | 5/1993 | Tattrie | |
| 5,217,277 A | 6/1993 | Rasnick et al. | |
| 5,375,805 A | 12/1994 | Sudak et al. | |
| D366,813 S | 2/1996 | Nobles | |
| 5,634,621 A * | 6/1997 | Jankovic | B60N 3/102 248/311.2 |
| 5,651,523 A | 7/1997 | Bridges | |
| 5,683,137 A * | 11/1997 | McDonald | A47D 15/00 297/188.09 |
| 5,709,429 A | 1/1998 | Bergin | |
| 5,720,171 A | 2/1998 | Osterhoff et al. | |
| 5,791,618 A | 8/1998 | Lancaster | |
| 5,834,834 A | 11/1998 | Lee et al. | |
| 5,865,412 A | 2/1999 | Mason | |
| 5,895,365 A * | 4/1999 | Tomlinson | A47C 20/027 297/149 |
| 5,897,041 A | 4/1999 | Ney et al. | |
| D410,748 S | 6/1999 | Hunsucker et al. | |
| 5,911,472 A | 6/1999 | Toth | |
| 5,915,832 A | 6/1999 | Baird, Sr. | |
| 6,053,880 A * | 4/2000 | Sleichter, III | A47C 7/40 297/217.3 |
| 6,065,848 A | 5/2000 | Tucker | |
| D428,308 S | 7/2000 | Hartmann et al. | |
| 6,092,905 A | 7/2000 | Koehn | |
| 6,106,058 A | 8/2000 | Sur et al. | |
| 6,121,585 A | 9/2000 | Dam | |
| 6,193,399 B1 | 2/2001 | Hulse | |
| 6,234,439 B1 | 5/2001 | Townsend et al. | |
| 6,282,906 B1 | 9/2001 | Cauchy | |
| 6,305,817 B1 | 10/2001 | Johnston et al. | |
| 6,386,629 B1 | 5/2002 | Severinski et al. | |
| 6,449,958 B1 | 9/2002 | Foye | |
| 6,505,734 B2 | 1/2003 | Su | |
| 6,641,101 B2 | 11/2003 | Bergin | |
| 6,793,363 B2 | 9/2004 | Jensen | |
| 6,817,894 B2 | 11/2004 | Sanner et al. | |
| 6,896,387 B2 | 5/2005 | Renfro | |
| 6,923,549 B2 | 8/2005 | Hoy | |
| 7,089,749 B1 | 8/2006 | Schafer | |
| 7,232,237 B2 | 6/2007 | Bigger | |
| 7,332,877 B2 | 2/2008 | Crodian et al. | |
| D580,233 S | 11/2008 | Camarota | |
| 7,681,346 B2 | 3/2010 | Bruce | |
| 7,721,839 B2 * | 5/2010 | Kim | B60K 20/00 180/315 |
| 7,794,000 B2 | 9/2010 | Ichimaru | |
| 7,934,773 B2 | 5/2011 | Boulais et al. | |
| D643,252 S | 8/2011 | Seidl et al. | |
| 8,714,505 B1 | 5/2014 | Stangle et al. | |
| 2001/0052153 A1 | 12/2001 | Schwartz et al. | |
| 2002/0160345 A1 | 10/2002 | Hempton | |
| 2003/0076672 A1 | 4/2003 | Head | |
| 2003/0085597 A1 | 5/2003 | Ludeke et al. | |
| 2003/0122392 A1 | 7/2003 | Larsen et al. | |
| 2004/0004376 A1 | 1/2004 | Cabebe et al. | |
| 2004/0031895 A1 | 2/2004 | Langhoff | |
| 2005/0001127 A1 * | 1/2005 | Schaal | B60N 3/102 248/311.2 |

(56) References Cited

U.S. PATENT DOCUMENTS

| | | | |
|---|---|---|---|
| 2005/0012375 A1 | 1/2005 | Giasson | |
| 2005/0161558 A1 | 7/2005 | Stahl et al. | |
| 2006/0016109 A1 | 1/2006 | Nicolaas | |
| 2006/0097121 A1 | 5/2006 | Fugate | |
| 2007/0139943 A1 | 6/2007 | Bone et al. | |
| 2007/0247836 A1 | 10/2007 | Seidl et al. | |
| 2012/0217772 A1* | 8/2012 | Tang | F25D 31/007 297/188.01 |

FOREIGN PATENT DOCUMENTS

| | | |
|---|---|---|
| DE | 29601008 | 3/1996 |
| EP | 0751037 B1 | 1/1997 |
| JP | 11346895 | 12/1999 |
| JP | D1122290 | 9/2001 |
| JP | 2002147918 | 5/2002 |
| KR | 19980045473 | 9/1998 |
| KR | 200322008 | 7/2003 |
| KR | 20030088330 | 11/2003 |
| KR | 2004053913 A | 6/2004 |
| KR | 20060114593 | 11/2006 |
| WO | WO 97/26490 | 7/1997 |
| WO | WO 2000/043232 | 7/2000 |
| WO | WO 03/105640 | 12/2003 |
| WO | WO 2006/015335 | 2/2006 |
| WO | WO 2006/023447 | 3/2006 |

OTHER PUBLICATIONS

Dodge Website Page, 2007 Dodge Caliber—Features and Vehicle Information, Apr. 18, 2006, http://www.dodge.com/en/caliber/vehicle.html.
Petition for Inter Partes Review, U.S. Pat. No. 8,714,505, Case No. IPR2019-00616, filed Jan. 22, 2019, available via PTAB E2E.
Petition for Inter Partes Review, U.S. Pat. No. D. 643,252, Case No. IPR2019-00530, filed Jan. 13, 2019, available via PTAB E2E.
Complaint, *Raffel Systems, LLC v. Man Wah Holdings Ltd., Inc., Man Wah (USA) Inc., and XYZ Companies 1-10*, US District Court for the Eastern District of Wisconsin, Case No. 2:18-cv-01765, Nov. 8, 2018, 53 pages.
Prosecution History of U.S. Pat. No. 8,714,505.
Declaration of Mingshao Zhang in Support of Man Wah Holdings Limited's Petition for Inter Partes Review of U.S. Pat. No. 8,714,505, dated Jan. 22, 2019, 136 pages.
Prosecution History of U.S. Pat. No. D. 643,252.
Prosecution History of U.S. Appl. No. 11/410,547.
Prosecution History of U.S. Appl. No. 12/847,823.
Declaration of Mingshao Zhang in Support of Man Wah Holdings Limited's Petition for Inter Partes Review of U.S. Pat. No. D. 643,252, dated Jan. 12, 2019, 78 pages.
Declaration of Julie Jager, Petition for Inter Partes Review of U.S. Pat. No. D. 643,252, dated Jan. 13, 2019, 3 pages.
Complaint for Patent Infringement, *Raffel Systems, LLC v. Eurotec Seating, Inc. (d/b/a Seatcraft; 4seating.com)*, US District Court for the Eastern District of Wisconsin, Case No. 2:16-cv-01257-WED, Filed Sep. 20, 2016, 17 pages.
Defendant Eurotec Seating, Inc.'s Answer to Complaint, Affirmative Defenses, and Counterclaims, Case No. 2:16-cv-01257-WED, Filed Dec. 7, 2016, 12 pages.
Answer of Defendants Home Meridian International, Inc. and Prime Resources International and Counterclaims of Home Meridian International, Inc., Case 2:15-cv-00022-RTR, Filed Mar. 2, 2015, 12 pages.
Plaintiff's Answer to Defendants' Counterclaims, Case 2:15-cv-00022-RTR, Filed Mar. 19, 2015, 4 pages.
Amended Complaint, Case 2:15-cv-00022-RTR, Filed May 14, 2015, 13 pages.
Answer of Defendants Home Meridian International, Inc. and Prime Resources International to Amended Complaint and Amended Counterclaims of Home Meridian International, Inc., Case 2:15-cv-00022-RTR, Filed May 31, 2015, 12 pages.
Answer of Costco Wholesale Corporation to Amended Complaint, Case 2:15-cv-00022-RTR, Filed May 31, 2015, 10 pages.
Answer of American Signature, Inc. to Amended Complaint, Case 2:15-cv-00022-RTR, Filed May 31, 2015, 10 pages.
Plaintiff's Answer to Defendants' Counterclaims, Case 2:15-cv-00022-RTR, Filed Jun. 18, 2015, 4 pages.
Second Amended Complaint, Case 2:15-cv-00022-RTR, Filed Aug. 25, 2015, 17 pages.
Complaint for Patent Infrinfement, Case 1:99-mc-09999, Filed Jan. 19, 2018, 93 pages.
Amended Complaint for Patent Infringement, Case 1:18-cv-00120-RGA, Filed Feb. 15, 2018, 33 pages.
Defendants Lippert Components, Inc. and Lippert Components Manufacturing, Inc.'s Answer to Plaintiff's Amended Complaint and Counterclaims, Case 1:18-cv-00120-RGA, Filed Mar. 26, 2018, 39 pages.
Defendants Lippert Components, Inc. and Lippert Components Manufacturing, Inc.'s First Amended Answer to Plaintiff's Amended Complaint and Counterclaim, C.A. No. 18-120 (RGA), Filed Jun. 21, 2018, 46 pages.
Plaintiff Raffel Systems, LLC's Answer to Defendants Lippert Components, Inc. and Lippert Components Manufacturing, Inc.'s Counterclaim, C.A. No. 18-0120-RGA, Filed Jul. 12, 2018, 7 pages.
Plaintiff Raffel Systems, LLC's Answer to Defendants Lippert Components, Inc. and Lippert Components Manufacturing, Inc.'s Counterclaim, Case 1:18-cv-00120-RGA, Filed Jul. 19, 2018, 6 pages.
Complaint, Case: 3:14-cv-00366, Filed May 22, 2014, 37 pages.
Complaint for Patent Infringement, Case 2:15-cv-00022-RTR, Filed Jan. 8, 2015, 35 pages.

\* cited by examiner

LIGHTED CUP HOLDER FOR SEATING ARRANGEMENTS

CROSS-REFERENCE TO RELATED APPLICATION

This Application is a Continuation of U.S. patent application Ser. No. 16/422,288, filed May 24, 2019, which is a Continuation of U.S. patent application Ser. No. 16/031,852, filed Jul. 10, 2018, now U.S. Pat. No. 10,299,603 issued May 28, 2019, which is a Continuation of U.S. patent application Ser. No. 15/868,191, filed Jan. 11, 2018, now U.S. Pat. No. 10,051,968 issued Aug. 21, 2018, which is a Continuation of U.S. patent application Ser. No. 15/421,115, filed Jan. 31, 2017, now U.S. Pat. No. 9,867,471 issued Jan. 16, 2018, which is Continuation of U.S. patent application Ser. No. 15/018,167, filed Feb. 8, 2016, now U.S. Pat. No. 9,585,486 issued Mar. 7, 2017, which is a Continuation of U.S. patent application Ser. No. 14/939,864, filed Nov. 12, 2015, now U.S. Pat. No. 9,254,043 issued Feb. 9, 2016, which is a Continuation of U.S. patent application Ser. No. 14/806,912, filed Jul. 23, 2015, now U.S. Pat. No. 9,192,241 issued Nov. 24, 2015, which is a Continuation of U.S. patent application Ser. No. 14/638,926, filed Mar. 4, 2015, now U.S. Pat. No. 9,089,221 issued Jul. 28, 2015, which is a Continuation of U.S. patent application Ser. No. 14/263,248, filed Apr. 28, 2014, now U.S. Pat. No. 8,973,882 issued Mar. 10, 2015, which is a Continuation of U.S. patent application Ser. No. 14/152,363, filed Jan. 10, 2014, now U.S. Pat. No. 8,714,505 issued May 6, 2014, which is a Continuation of U.S. patent application Ser. No. 12/847,823, filed Jul. 30, 2010, now U.S. Pat. No. 8,657,245 issued Feb. 25, 2014, which is a Continuation of U.S. patent application Ser. No. 11/410,547, filed Apr. 25, 2006, now U.S. Pat. No. 7,766,293 issued Aug. 3, 2010, the entirety of each of which is herein incorporated by reference.

BACKGROUND OF THE INVENTION

Field of the Invention

The present invention relates generally to providing cup holders, for beverages or food items such as popcorn or fast food, in seating arrangements, such as furniture, seating in passenger vehicles, aircraft or boats, and theatre seating, and more particularly to providing lighted cup holders for such seating arrangements.

In recent years, seating arrangements, such as upholstered chairs and sofas have sometimes included tables and cup holders for supporting food and snack items, or beverages within easy reach of occupants of the chair or sofa. This has particularly been the case for specialized upholstered seating arrangements specifically designed for use with home theater equipment. In some of these seating arrangements, the table surfaces and cup holders may be incorporated into an armrest, a spacer unit in a modular seating arrangement, or a fold-down backrest section of a sofa, as shown, for example, in U.S. Pat. No. 5,104,182, to Rasnick et al. Seating arrangements of the type typically utilized in movie theaters also sometimes include cup holders, for beverages or food items such as popcorn. U.S. Pat. No. 4,863,134, to Young et al, for example, shows a combination cup holder and armrest of the type used in movie theater seating arrangements.

Seating arrangements in vehicles, aircraft and boats are also sometimes utilized in conjunction with cup holders mounted in center consoles, dashboards, or accessory tables mounted adjacent the seating arrangement. The following U.S. patents illustrate prior approaches to providing cup holders in vehicles, located in center consoles, etc., of a vehicle, located adjacent a seating apparatus of the vehicle: U.S. Pat. No. 6,896,387 B2, to Renfro; U.S. Pat. No. 6,234,439 B1, to Townsend et al; U.S. Pat. No. 6,193,399 B1 to Hulse; and U.S. Pat. No. 5,375,805 to Sudak et al. In some applications, it would be desirable to provide a cup holder as part of the seating arrangement, rather than having the cup holder located in an adjacent structure.

All of the above mentioned seating arrangements are often utilized under conditions of complete darkness, or limited visibility, in which it may be difficult to readily locate the cup holders. In a home theater seating arrangements, for example, this may lead to spillage of beverages or food items, resulting in staining or other damage being done to the seating arrangement or flooring materials adjacent to the seating arrangement. The inability to quickly locate a cup holder adjacent to a seating arrangement in a vehicle or a boat may result, not only in spillage of the beverage or food, but may also cause the operator of the vehicle or boat to be dangerously distracted.

In cup holders used in conjunction with seating arrangements in a boat, not being able to locate a cup holder during hours of darkness may result in beverage and food containers falling overboard and contributing to pollution of the waterway in which the boat is operating. In movie theater seating arrangements, spillage of beverages and food items, caused by inability to accurately locate a cup holder, may significantly increase the time and cost required for cleaning of the theater and lead to customer dissatisfaction with a general lack of cleanliness, sticky floors, or wet seats.

It is desirable, therefore, to provide an improved apparatus and method for incorporating cup holders into seating arrangements which are commonly used in darkness or reduced visibility, in such a manner that the cup holder is easier to locate in darkness or under reduced visibility conditions. It is further desirable that such improvements be made in a form which can be readily incorporated into existing seating arrangements, in a manner which is unobtrusive and does not require any additional effort on the part of an occupant of the seating arrangement to utilize the cup holder.

SUMMARY OF THE INVENTION

The disadvantages and limitations of the background art discussed above are overcome by the present invention. The invention provides an improved apparatus and method for constructing and using a cup holder in a seating arrangement, by attaching a lighted cup holder to the seating arrangement. The lighted cup holder includes a cup holder body and a light-producing light source, with the cup holder body being attached to the seating arrangement and having a cup receptacle therein, and the light-producing source being disposed within the cup receptacle for illuminating the receptacle. Illuminating the cup holder, with a light source disposed within the receptacle of the cup holder significantly facilitates location and proper use of the cup holder during reduced visibility or total darkness conditions, through the use of indirect lighting in a manner which is inconspicuous and non-distracting to an occupant of the seating arrangement.

In some forms of the invention, a light-sensitive element is operatively connected to the light source for selectively controlling the light source, in such a manner that the light source does not produce light when the light-sensing element detects ambient light of a selected intensity. In this manner, illumination of the cup holder is automatically provided only under conditions where visibility is reduced to the point that it becomes difficult to locate the cup holder.

Some forms of the invention include a master lighted cup holder and one or more slave lighted cup holders operatively connected to the master lighted cup holder in such a manner that the light sources in the slave lighted cup holders produce light only when commanded to do so by the master lighted cup holder. The master lighted cup holder may include a light-sensitive element, mounted on the body of the master lighted cup holder, and operatively connected to the light sources of both the master and slave lighted cup holders, for selectively controlling production of light by the light sources in both the master and slave cup holders in such a manner that the light-sensitive element causes the light sources to not produce light when the light-sensitive element detects ambient light of a selected intensity.

In some forms of the invention, a lighted element is disposed within the cup receptacle and operatively connected to the light source for receiving light from the light source and illuminating the receptacle. The lighted element may take a variety of forms, such as an elongated member of translucent material having the light source attached thereto. The elongated member of translucent material may form a ring having an inner periphery thereof sized to allow for passage therethrough of a cup to be held by the cup holder.

A cup holder body, according to the invention may include a substantially tubular side wall which is substantially closed at a lower end thereof by a bottom wall, and open at a top end thereof, such that the tubular side wall and bottom define the cup holding receptacle. The lighted element may be attached within the receptacle, adjacent to the bottom wall of the cup holder. The tubular side wall may further be stepped inward to form a mounting surface for the lighted element, with the lighted element being mounted on the mounting surface.

In some forms of the invention, a light-sensitive element may be mounted remotely from the cup holder body. In other forms of the invention, the light-sensitive element may be mounted on the cup holder body. Where the light-sensitive element is mounted on the cup holder body, the cup holder body may include a substantially tubular side wall defining an axis of the cup holder, a bottom wall substantially closing the lower end of the cup holder, and an open top end of the cup holder having a flange extending substantially radially outward from the tubular side wall, such that the tubular side wall and bottom wall define the cup holding receptacle. The lighted element may be attached within the receptacle adjacent to the bottom wall of the cup holder body, with the light-sensitive element being attached to the flange at the upper end of the cup holder for receiving ambient light and pinging on the upper end of the cup holder.

A lighted cup holder, according to the invention, may be provided in a form which is substantially identical to non-lighted cup holders previously used in seating arrangements, to thereby facilitate incorporation of embodiments of the invention into new seating arrangements and retro-fitting of embodiments of the invention into existing seating arrangements.

Some embodiments of the invention may further include incorporation of additional features into the lighted cup holder. For example, in seating arrangements including a massaging mechanism, a lighted cup holder, according to the invention, may include a massage controller operatively connected to the massaging mechanism for control thereof, with the massage controller having a user-controllable input for operating the massaging mechanism. The body of a cup holder, according to the invention, may include a flange extending outwardly therefrom, for example, into which a massage controller, or other devices such as a USB connector, or other types of controls or connectors as appropriate.

The invention may be utilized on seating arrangements having cup holders mounted on folding backrests, or other stowable portions of the seating apparatus. In such embodiments, a lighted cup holder apparatus, according to the invention, may include a positionable actuated on-off switch configured to automatically override the light-sensitive element, to turn off the illumination when the movable portion of the seating arrangement is placed in the stowed position.

A lighted cup holder apparatus, according to the invention, may include a seating arrangement with one or more lighted cup holders attached thereto. The invention may also be practiced in the form of a method for constructing or operating a lighted cup holder apparatus, according to the invention.

Other aspects, objects and advantages of the invention will be apparent from the following detailed description and drawings of exemplary embodiments.

DESCRIPTION OF THE DRAWINGS

The accompanying drawings incorporated in and forming a part of the specification illustrate several aspects of the present invention, and together with the description serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE PREFERRED EMBODIMENT

Figure 1:
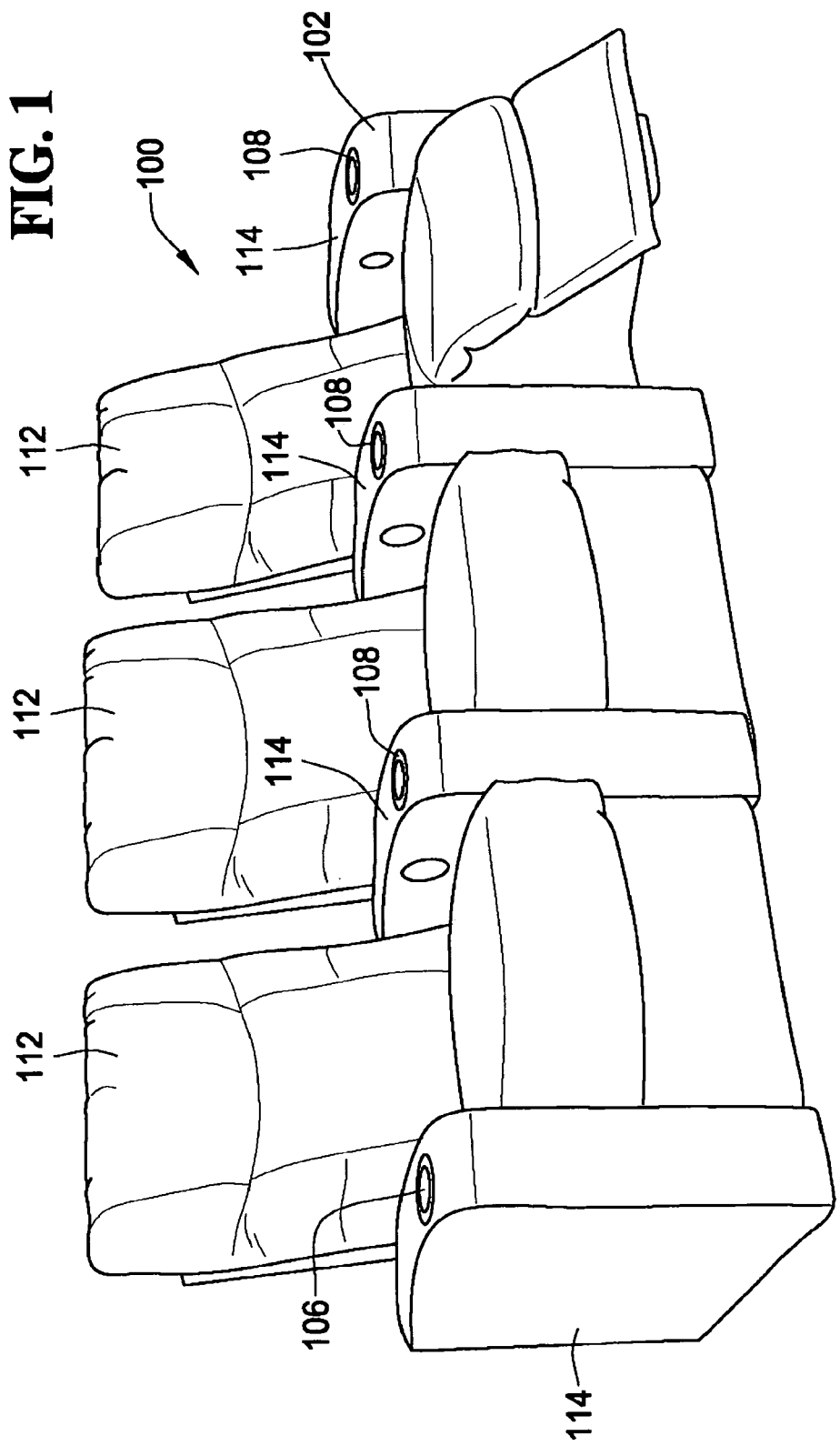
FIG. 1 is a perspective illustration of a first exemplary embodiment of a lighted cup holder apparatus, according to the invention, including a lighted cup holder circuit having one master and three slave lighted cup holders attached to a seating arrangement.

FIG. 1 shows a first exemplary embodiment of a lighted cup holder apparatus 100, according to the invention, including a seating arrangement 102, and a lighted cup holder circuit 104, including a master lighted cup holder 106, three slave lighted cup holders 108, and a transformer 110. Electrical interconnection between the master lighted cup holder, the three slave lighted cup holders 108, and the transformer 110 are illustrated schematically in FIG. 2. Construction of the master and slave lighted cup holders 106, 108 is described in greater detail below.

As shown in FIG. 1, the seating arrangement 102 of the first exemplary embodiment of the lighted cup holder apparatus 100, according to the invention, includes three upholstered reclining chair portions 112, having upholstered armrests 114 located on either side of the reclining chair portions 112, to form a furniture unit of the type commonly marketed for use with home theater equipment. The master and slave lighted cup holders 106, 108 are located in the armrests 108, to thereby provide ready access to occupants of the seating arrangement 102.

Figure 2:
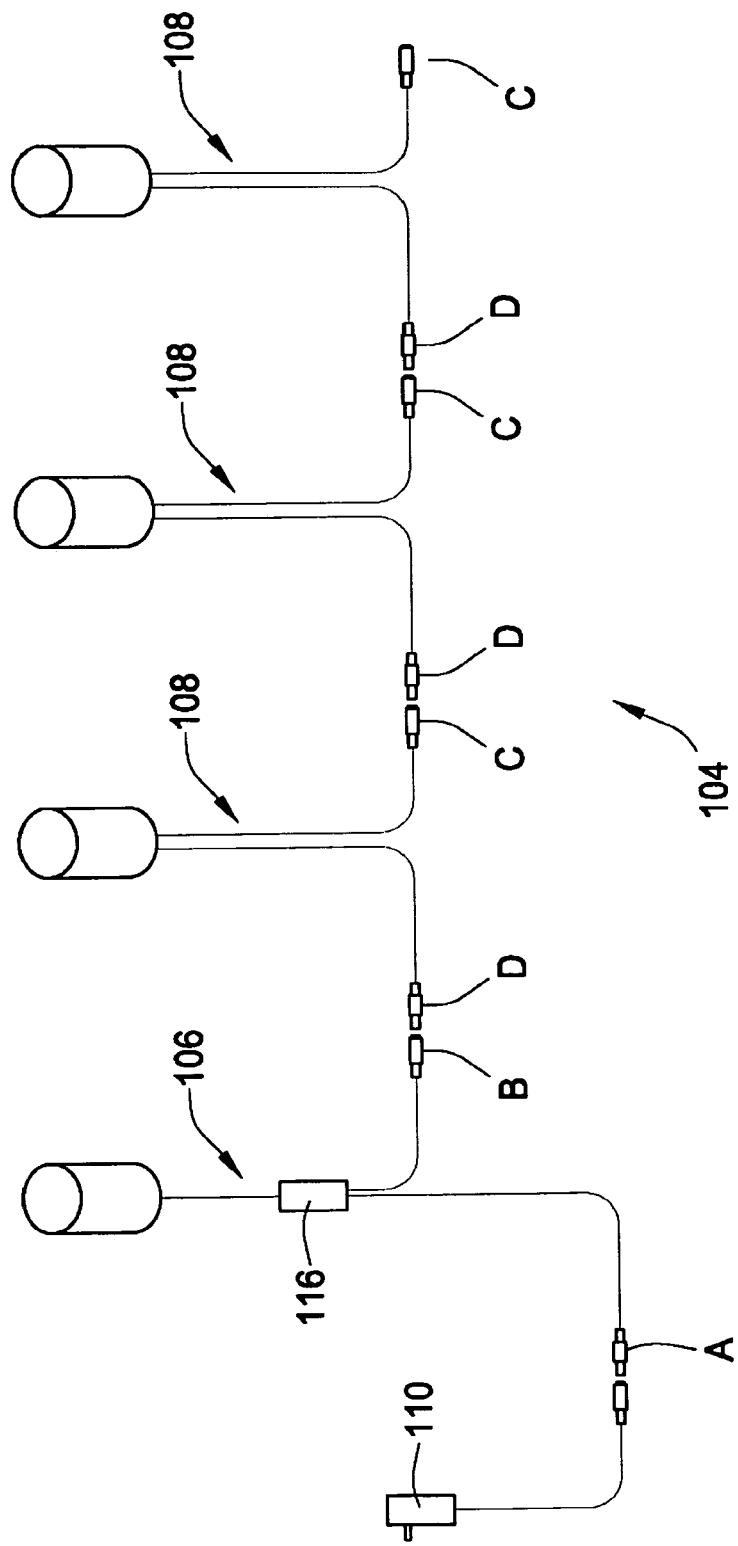
FIG. 2 is a schematic illustration of the lighted cup holder circuits of the exemplary embodiment of FIG. 1.

As shown in FIG. 2, the master lighted cup holder includes a cup holder controller 116, having a first electrical connection A with the transformer 110, and a second electrical connector B, for connection thereto of one of the slave lighted cup holders 108 through a mating connector D of the slave lighted cup holder 108. Each of the slave lighted cup holders 108 includes an additional electrical connector C, which is mateable with a corresponding connector D of an adjacent slave lighted cup holder 108, such that all of the slave lighted cup holders 108 are operatively connected to be controlled by the cup holder controller 116 of the master lighted cup holder 106.

Figure 3:
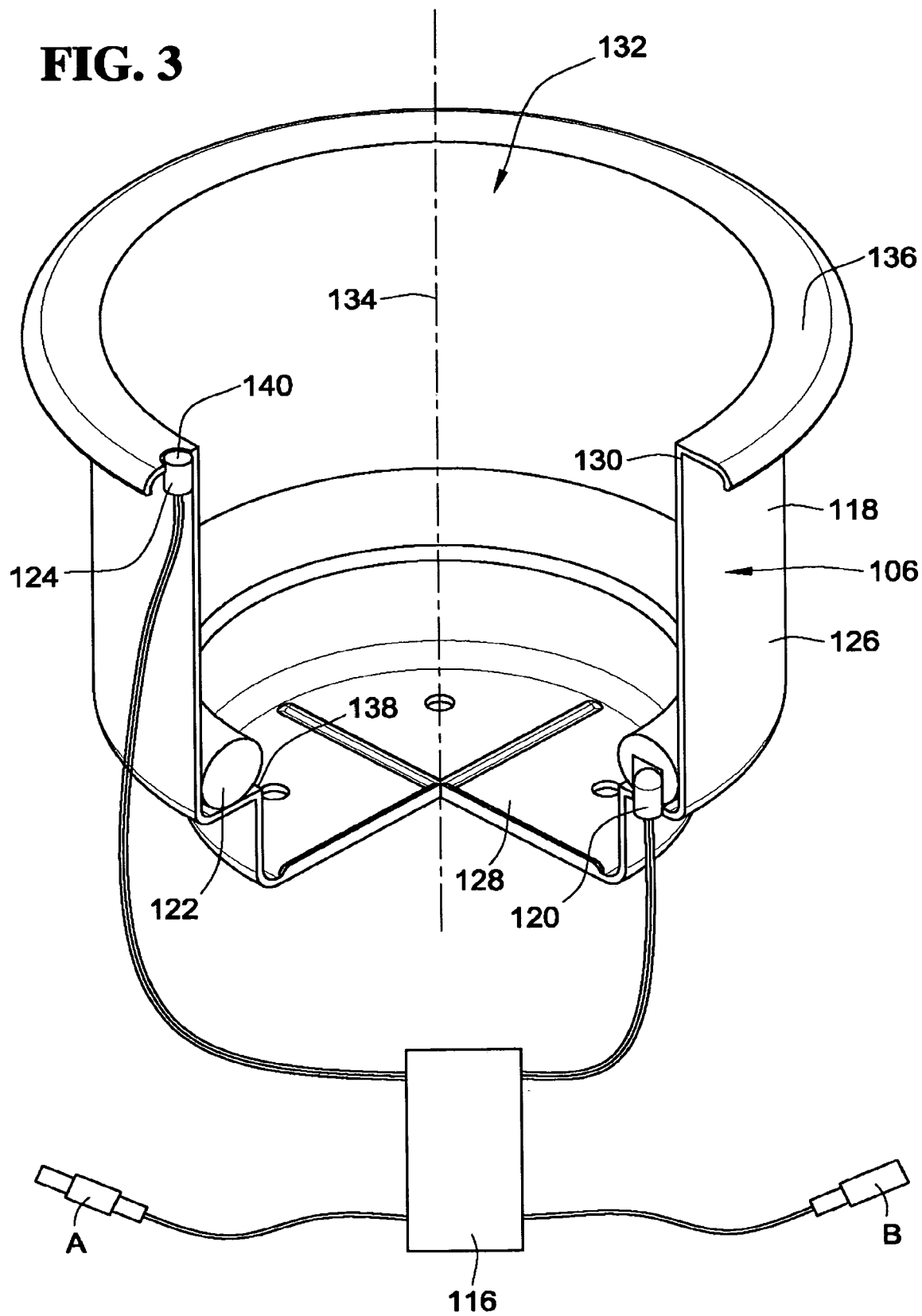
FIG. 3 is a partially cut-away perspective illustration of the master lighted cup holder of the exemplary embodiment of FIG. 1.

As shown in FIG. 3, the master lighted cup holder 106 includes a cup holder body 118, a light producing light source 120, a lighted element 122 and a light-sensitive element 124. The lighted element 122, of the exemplary embodiment, takes the form of an elongated member of translucent material, formed into a ring, and having the light source 120 attached thereto for illuminating the lighted element 122. It is contemplated that the lighted element would be formed from a transparent or translucent material such as plastic or glass, a portion of a fiber optic cable, or from any other appropriate material.

The cup holder body 118 is adapted for attachment to the armrests 114 of the seating arrangement 102. The cup holder body 118, of the exemplary embodiment, includes a substantially tubular side wall 126 which is substantially closed at a lower end thereof by a bottom wall 128 and open at a top end 130 thereof, such that the tubular side wall 118 and bottom wall 128 define a cup holding receptacle 132. In other embodiments of the invention, the side wall 126 and bottom wall 128 may include one or more slots or holes therethrough.

The tubular side wall 126 of the cup holder body 118 also defines an axis 134 of the master lighted cup holder 106, and the cup holder body 118. The cup holder body 118 further includes a flange 136 extending substantially radially outward from the tubular side wall 126 at the open top end 130 of the cup holder 106.

The tubular side wall 126 is stepped inward, adjacent the bottom wall 128, to form a mounting surface 138 adjacent the bottom wall 128. The lighted element 122 is mounted on the mounting surface 138, within the receptacle 132, adjacent the bottom wall 128 of the cup holder body 118.

By virtue of this arrangement, both the lighted element 122 and the light source 120 attached to the lighted element 122 are located within the receptacle 132 adjacent the bottom wall 128 of the cup holder body 118. In the exemplary embodiment, the light source is a light emitting diode (LED), but, in other embodiments of the invention, any other appropriate light source may be utilized. LED's are particularly well suited for use as the light source 120 because they produce much less heat than incandescent bulbs.

The light-sensitive element 124 is attached to, and extends through the flange 136 at the top end 130 of the body 118 of the cup holder 106, in such a manner that a light sensitive surface 140 of the light-sensitive element 124 is exposed to ambient light impinging upon an upper surface of the flange 136.

The light source 120 and light-sensitive element 124, of the master lighted cup holder 106, are operatively connected to one another, and the electrical connectors A, B by the cup holder controller 116 in such a manner that the cup holder controller 116 will only allow electrical power from the connector A to reach the light source 120 and the electrical connector B of the master lighted cup holder 106 when ambient light, as detected by the light sensitive surface 140 of the light-sensitive element 124 drops below a pre-selected lower threshold of intensity. Conversely, when ambient light falling upon the light sensitive surface 140 of the light-sensitive element 124 exceeds a second pre-selected threshold, the light-sensitive element 124 will signal the cup holder 116 to cut off power to the light source 120 and the connector B of the master lighted cup holder 106.

Figure 4:
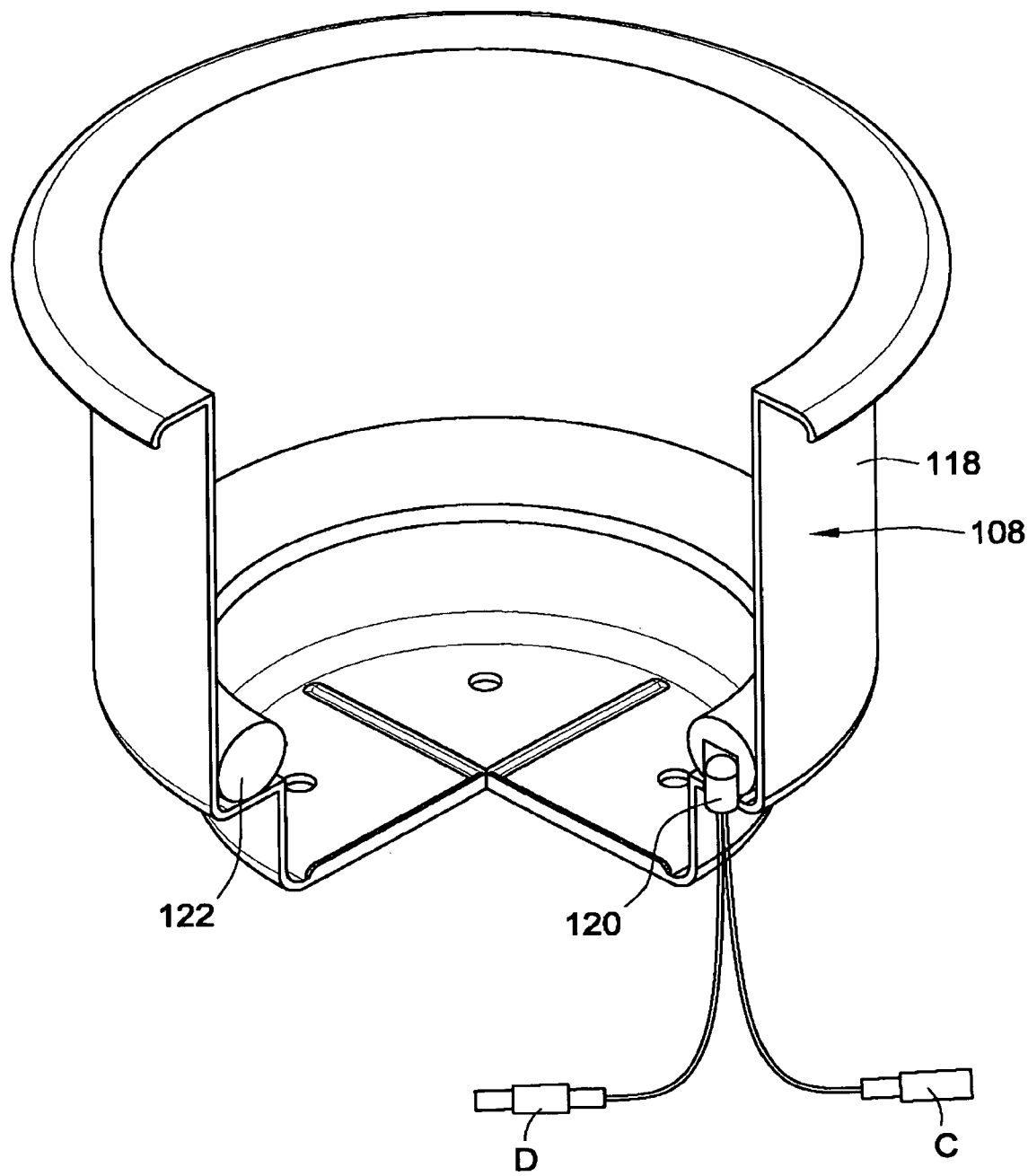
FIG. 4 is a partially cut-away perspective illustration of one of the slave lighted cup holders of the exemplary embodiment of FIG. 1.

As shown in FIG. 4, the slave lighted cup holders 108, of the exemplary embodiment of the first exemplary embodiment of the lighted cup holder apparatus 100, are essentially identical to the master lighted cup holder 106, with the exemption that the slave lighted cup holders 106 do not include the light-sensitive element 124 or the cup holder controller 116. For purposes of manufacturing economy and inventory reduction, the cup holder body 118, lighted element 122 and light source 120, of the slave lighted cup holders 108 are identical to the equivalent parts of the master lighted cup holder 106, in the exemplary embodiments of the invention specifically described herein. It will be understood, however, that in other embodiments of the invention, the master and slave lighted cup holders 106, 108 need not have identical configurations.

As discussed above, in relation to FIG. 2, the light source 120 of the slave lighted cup holders 108 is connected to a first electrical connector D configured to mate with and receive electrical power from the connector B of the master lighted cup holder 106. The light source 120 of the slave cup holder 108, of the exemplary embodiment, also is operatively connected to provide power through an output connector C which is configured to mate with the input connector D of another one of the slave lighted cup holders 108. In the exemplary embodiment of the invention, all of the slave lighted cup holders are identical, with each including both the input connector D and the output connector C. It will be recognized, however, by those having skill in the art, that in other embodiments of the invention, the output connector C may be eliminated from the slave lighted cup holder 108 at the distal end of the lighted cup holder circuit 104 shown in FIG. 2.

Figure 5:
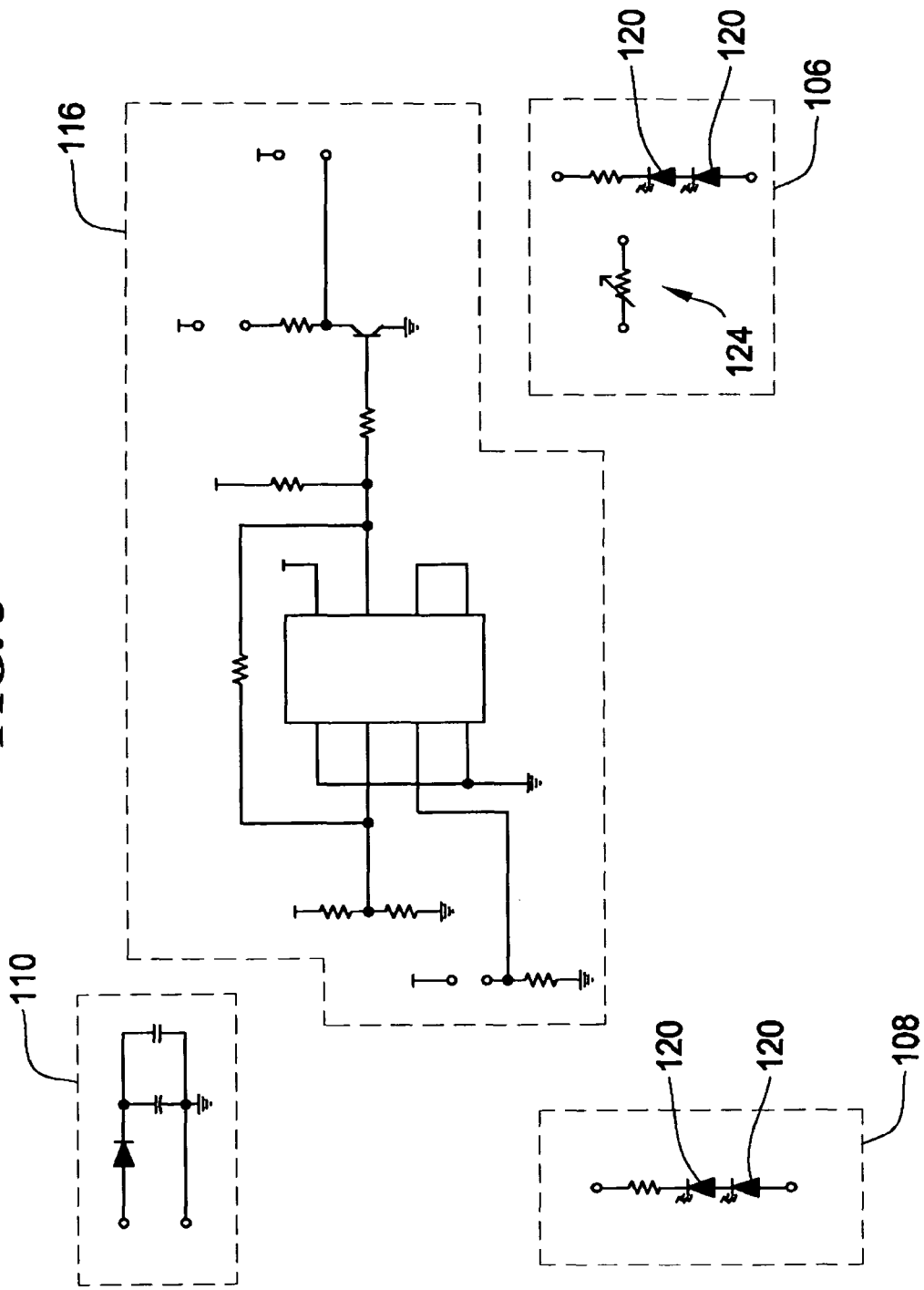
FIG. 5 is an electrical schematic illustrating an electrical circuit of an exemplary embodiment of the invention.

Although not specifically shown in the drawings discussed thus far, it will be understood that the invention may be practiced with multiple light sources 120 attached to a common lighted element 122, or multiple lighted elements 122, in other embodiments of the invention. FIG. 5 is an electrical schematic illustrating the internal electrical construction of the cup holder controller 116, transformer 110, and master and slave lighted cup holders 106, 108, in an embodiment of the invention where both the master and slave lighted cup holders 106, 108 each include two light sources 120 in the form of light emitting diodes. In other forms of the invention having lighted cup holders located in a folding backrest, or other stowable structure, which would block ambient light from impinging on the light-sensitive element when the stowable structure is in the stowed position, the electrical construction of the invention may also include a positionally actuated on-off switch (not shown) for over-riding the light-sensitive element when the stowable structure is in the stowed position.

Figure 6:
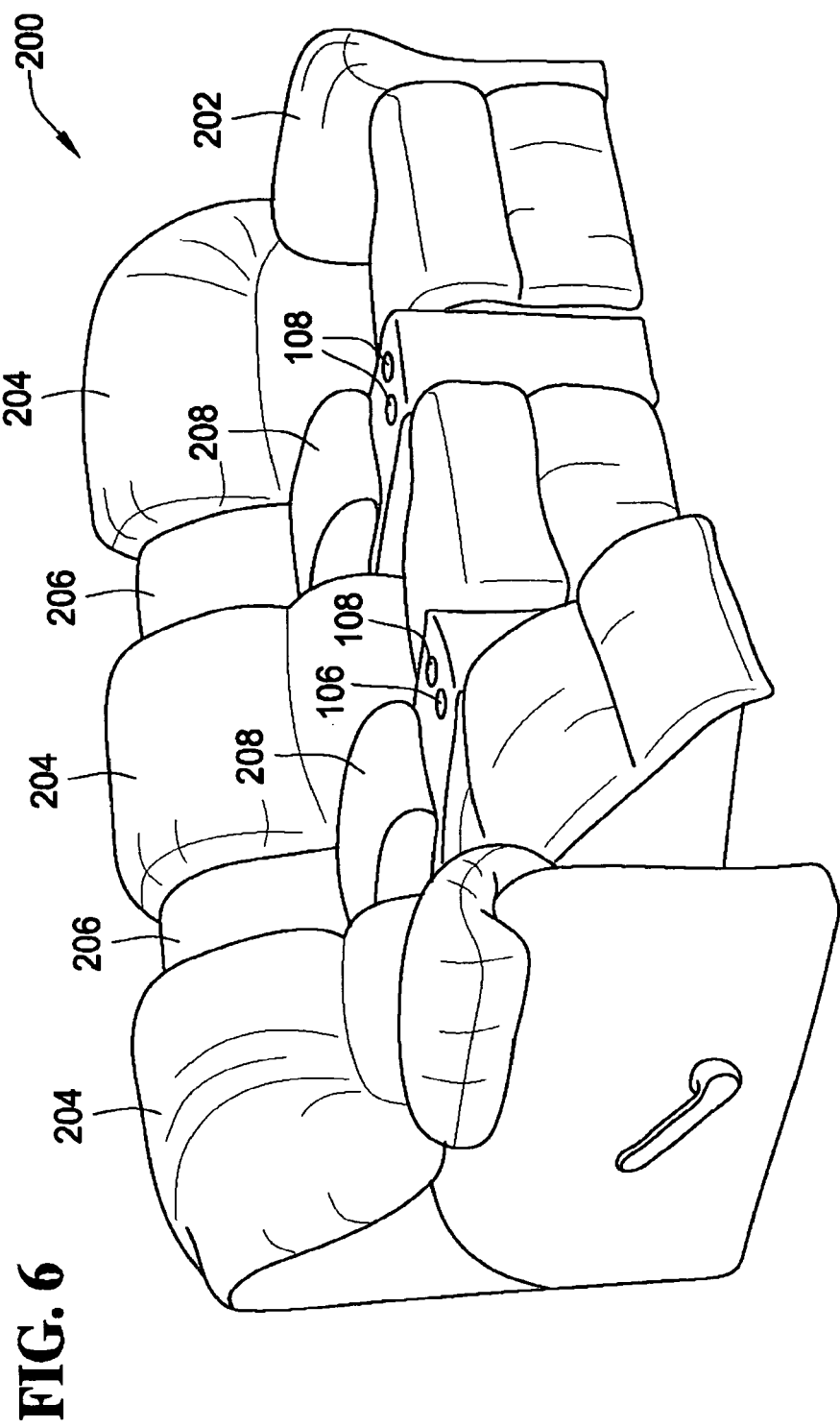
FIG. 6 is a perspective illustration of a second exemplary embodiment of a lighted cup holder apparatus, according to the invention, including a seating arrangement to which the master and slave lighted cup holders are attached in a different manner than the exemplary embodiment of FIG. 1.

Those having skill in the art will recognize, that the invention is not limited to use with the specific seating arrangement 102 shown in FIG. 1, as described above. For example, as shown in FIG. 6, a second exemplary embodiment of a lighted cup holder apparatus 200, according to the invention, includes a seating arrangement 202 having three upholstered reclining chair portions 206 connected by modular spacing units 204, disposed between the three upholstered reclining chair portions 204. The modular spacers 206 each include an upholstered armrest 208. Master and slave lighted cup holders 106, 108, configured and connected in the manner described above in relation to the first exemplary embodiment 100, are mounted in the modular spacers 206, within easy reach of occupants of the chair portions 204.

Figure 7:
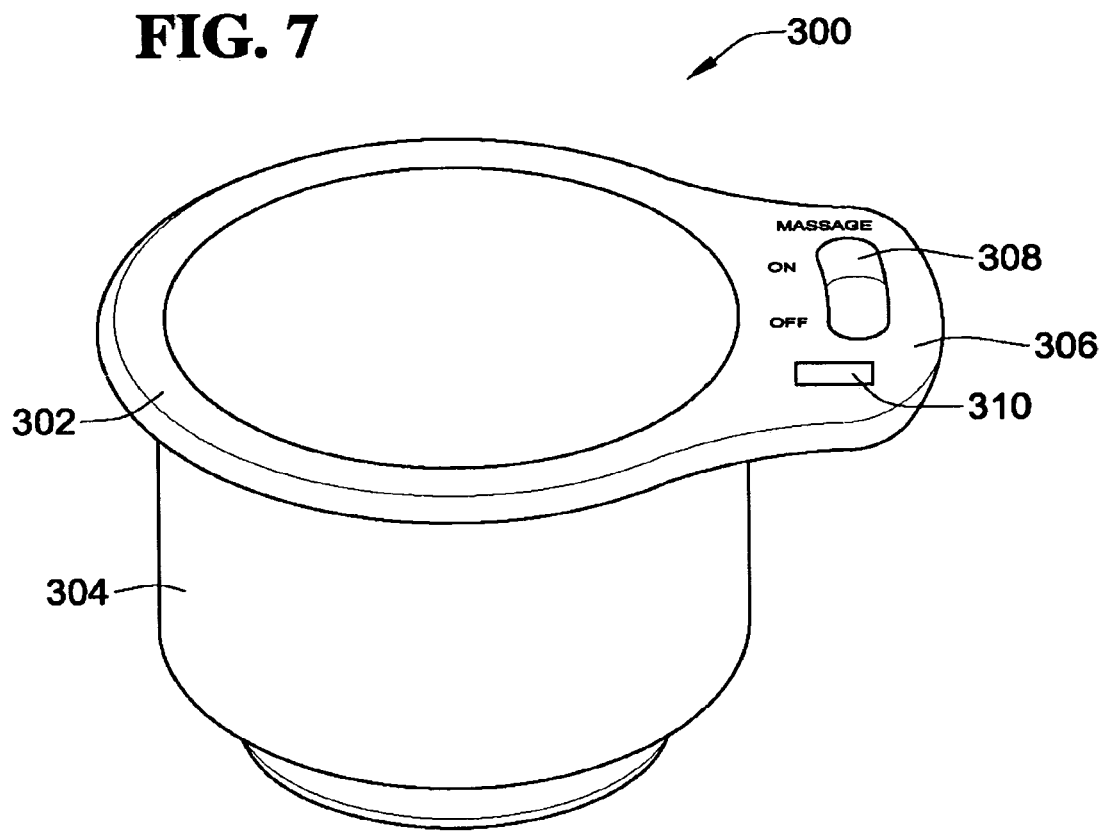
FIG. 7 is a perspective illustration of a third exemplary embodiment of the invention, in the form of a lighted cup holder having attached thereto control and signal connections for functions of a seating arrangement not directly related to operation of the illumination circuit of the lighted cup holder.

FIG. 7 shows another exemplary embodiment of a lighted cup holder 300, according to the invention, in which a flange 302 of the cup holder body 304 includes an expanded section 306 thereof, for mounting therein of a control switch 308 for a massage mechanism of a seating arrangement, and a USB port 310. As will be understood, by those having skill in the art, various other types of controls and connections may alternatively be included in a flange, or be otherwise attached to a lighted cup holder, according to the invention. For example, other types of outputs for connection of an audio headset may be provided, together with an individual volume control for each of the occupants using the seating arrangement. In similar fashion, for seating arrangements which do not have a massager, but may, for example, have a powered, reclining mechanism, appropriate controls may be included in a lighted cup holder, according to the invention. By incorporating such controls and connectors into the lighted cup holder, construction of the seating arrangement may be simplified, and aesthetic appearance be approved.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Although the foregoing description of the present invention has been shown and described with reference to particular embodiments and applications thereof, it has been presented for purposes of illustration and description and is not intended to be exhaustive or to limit the invention to the particular embodiments and applications disclosed. It will be apparent to those having ordinary skill in the art that a number of changes, modifications, variations, or alterations to the invention as described herein may be made, none of which depart from the spirit or scope of the present invention. The particular embodiments and applications were chosen and described to provide the best illustration of the principles of the invention and its practical application to thereby enable one of ordinary skill in the art to utilize the invention in various embodiments and with various modifications as are suited to the particular use contemplated. All such changes, modifications, variations, and alterations should therefore be seen as being within the scope of the present invention as determined by the appended claims when interpreted in accordance with the breadth to which they are fairly, legally, and equitably entitled.

What is claimed is:

1. A seating arrangement comprising a cup holder apparatus, the cup holder apparatus comprising at least one cup holder having a cup holder body adapted for attachment to the seating arrangement, wherein the cup holder body has a lower end, a top end, and a cup holding receptacle therebetween, and a flange extending from the top end of the cup holder body, wherein the flange comprises two or more control switches, wherein one of the two or more control switches is operatively connected to a light source for control thereof and one of the two or more control switches is operatively connected to a component of the seating arrangement for control thereof.

2. The seating arrangement of claim 1, wherein the component of the seating arrangement is a powered reclining mechanism of the seating arrangement.

3. The seating arrangement of claim 1, wherein the component of the seating arrangement is a massaging mechanism of the seating arrangement.

4. The seating arrangement of claim 1, wherein the light source is a light emitting diode (LED).

5. The seating arrangement of claim 4, wherein the light emitting diode (LED) illuminates the cup holder apparatus.

6. The seating arrangement of claim 1, wherein the flange further comprises a USB port.

7. The seating arrangement of claim 1, wherein the seating arrangement is selected from the group consisting of a chair, a loveseat, and a sofa.

8. The seating arrangement of claim 1, wherein one of the two or more switches is operatively connected to a light source for control thereof and one of the two or more switches is operatively connected to a power recline mechanism for control thereof.

9. The seating arrangement of claim 1, wherein the seating arrangement is a sofa comprising two reclining chair portions.

10. The seating arrangement of claim 9, wherein the two reclining chair portions are connected by a modular spacing unit.

11. A cup holder apparatus for a seating arrangement, the cup holder apparatus comprising at least one cup holder having a cup holder body adapted for attachment to the seating arrangement, wherein the cup holder body has a lower end, a top end, and a cup holding receptacle therebetween, and a flange extending from the top end of the cup holder body, wherein the flange comprises two or more control switches, wherein one of the two or more control switches is operatively connected to a light source for control thereof and one of the two or more control switches is operatively connected to a component of the seating arrangement for control thereof.

12. The cup holder apparatus of claim 11, wherein the component of the seating arrangement is a powered reclining mechanism of the seating arrangement.

13. The cup holder apparatus of claim 11, wherein the light source is a light emitting diode (LED).

14. The cup holder apparatus of claim 13, wherein the light emitting diode (LED) illuminates the cup holder apparatus.

15. The cup holder apparatus of claim 13, wherein the light emitting diode (LED) illuminates the cup holding receptacle.

16. The cup holder apparatus of claim 11, wherein the flange further comprises a USB port.

17. The cup holder apparatus of claim 11, wherein the flange extends outwardly from the top end of the cup holder body.

18. The cup holder apparatus of claim 11, wherein the cup holder apparatus is attached to a seating arrangement selected from the group consisting of a chair, a loveseat, and a sofa.

19. The cup holder apparatus of claim 11, wherein one of the two or more switches is operatively connected to a light source for control thereof and one of the two or more switches is operatively connected to a power recline mechanism for control thereof.

* * * * *